United States Patent [19]

Itagaki et al.

[11] Patent Number: 4,695,678

[45] Date of Patent: Sep. 22, 1987

[54] ELECTRONIC DEVICE CARRIER

[75] Inventors: Masanori Itagaki; Junichi Takahashi, both of Tokyo; Hideyasu Endou, Atsugi, all of Japan

[73] Assignee: Ricoh Company, Ltd., Tokyo, Japan

[21] Appl. No.: 658,147

[22] Filed: Oct. 5, 1984

[30] Foreign Application Priority Data

Oct. 8, 1983 [JP] Japan ................................ 58-187694

[51] Int. Cl.⁴ ............................................ H01L 23/02
[52] U.S. Cl. .................................. 174/52 FP; 330/68
[58] Field of Search .......................... 174/35 R, 52 FP; 330/59, 68; 307/91, 200 A; 250/213 R; 333/12; 365/53

[56] References Cited

U.S. PATENT DOCUMENTS

| 2,598,259 | 5/1952 | Hogue | 330/68 X |
| 3,196,364 | 7/1965 | Latham, Jr. | 330/68 |
| 3,868,724 | 2/1975 | Perrino | 174/52 FP X |
| 4,316,320 | 2/1982 | Nogawa et al. | 174/52 FP X |
| 4,372,037 | 2/1983 | Scapple et al. | 174/52 FP X |

OTHER PUBLICATIONS

Stapper, Jr., *Flat Film Memory*, IBM Technical Disclosure Bulletin, vol. 6, No. 2, pp. 71, 72, Jul. 1963.

*Primary Examiner*—Arthur T. Grimley
*Assistant Examiner*—David A. Tone
*Attorney, Agent, or Firm*—Cooper, Dunham, Griffin & Moran

[57] ABSTRACT

An electronic device carrier structure includes at least one signal line which is connected to an electronic device, such as a one-chip operational amplifier, and at least a pair of guard lines extending substantially along the corresponding signal line each at one side thereof thereby preventing an electrical signal carried on the signal line from being adversely affected. Such a structure is preferably applied to a one-to-one image sensor including a single array of photoelectric elements and operational amplifier chips for amplifying signals supplied from the photoelectric elements through signal lines connected therebetween.

5 Claims, 5 Drawing Figures

ELECTRONIC DEVICE CARRIER

BACKGROUND OF THE INVENTION

1. Field of the Invention

This invention generally relates to a structure for carrying thereon an electronic device, such as a one-chip integrated circuit, and, in particular, to an electronic device mounting structure in which it is so structured that an input line connected to the device is protected against external noises. More specifically, the present invention is concerned with an electronic device carrier structure which may be advantageously applied to a one-to-one or unity magnification image sensor for use in a facsimile machine and the like as an input unit for optically reading an original.

2. Description of the Prior Art

Various types of one-to-one image sensors have been proposed for use in facsimile machines, copiers and the like as input units for optically reading an original. In those types of one-to-one image sensors which use photoelectric elements arranged in the form of an array, amplifier circuits must be provided because electric signals produced by such photoelectric elements are relatively low in level. In typical prior art one-to-one image sensors, a plurality of photoelectric elements arranged in the form of a straight line and amplifier circuits for amplifying electrical signals from the photoelectric elements were mounted on separate substrates as connected through relatively long interconnection lines. Thus, there were disadvantages in significant reduction in the level of signal currents due to passage through such relatively long interconnection lines and susceptibility to external noises.

SUMMARY OF THE INVENTION

It is therefore a primary object of the present invention to obviate the disadvantages of the prior art as described above and to provide an improved electronic device carrier structure.

Another object of the present invention is to provide an improved structure for mounting an electronic device, such as a one-chip integrated circuit, in which at least an input line connected to the electronic device is well protected against external noises.

A further object of the present invention is to provide a carrier structure for mounting thereon an electronic device, such as an operational amplifier integrated circuit, wherein a guard region connected to a reference potential is provided at least along an input line to the electronic device thereby allowing an input signal passing through the input line from being adversely affected by external noises.

A still further object of the present invention is to provide a one-to-one image sensor for use in an image processing apparatus, such as a facsimile machine, in which signal input lines are provided as connected between an array of photoelectric elements and amplifier circuits, such as operational amplifiers, and a guard line connected to ground is provided at each side of the signal input lines thereby allowing electrical signals carried on the signal input lines to be protected from being adversely affected by external noises.

Other objects, advantages and novel features of the present invention will become apparent from the following detailed description of the invention when considered in conjunction with the accompanying drawings.

DESCRIPTION OF THE PREFERRED EMBODIMENTS

Figure 1:
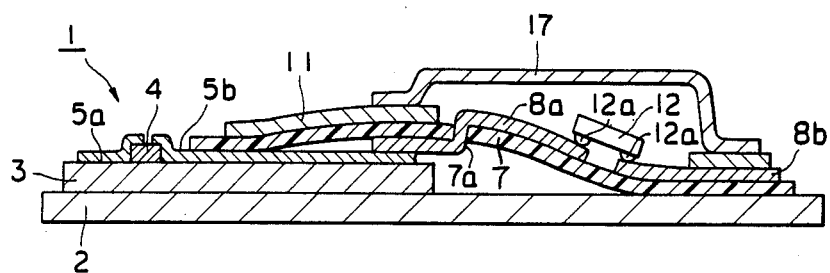
FIG. 1 is a schematic, cross-sectional view showing the structure of a one-to-one image sensor constructed with the application of one embodiment of the present invention.

Referring now to FIG. 1, there is shown in cross-section a one-to-one image sensor 1 for use in a facsimile machine and the like as an input unit for optically reading an original, which is constructed in accordance with one embodiment of the present invention. The illustrated image sensor is provided with operational amplifiers in the form of integrated circuits for amplifying electrical signals produced by an array of photoelectric elements. As will become clear later, the array of photoelectric elements are formed on a hard substrate in the form of thin film and the op amp I.Cs. are mounted on a separate flexible tape and electrically connected to corresponding photoelectric elements via interconnection lines.

As shown in FIG. 1, the one-to-one (unity magnification) image sensor 1 includes a support 2 on which every element of the sensor 1 is ultimately supported, and the support 2 is comprised preferably of an electrically conductive material and more preferably of metal, such as copper and aluminum. A sensor board 3 is adhesively mounted on the left half of the support 2, and a plurality of photoelectric elements 4 are provided on the sensor board 3 in the form of a single array along one edge (leftmost edge in FIG. 1) of the board 3. The photoelectric elements 4 may be formed from any suitable photoconductive material well known in the art, for example, by a film forming method, such as thin-film technique, and they change their resistive values depending on the amount of light impinging thereon thereby converting light image information into electrical signals.

Figure 2:
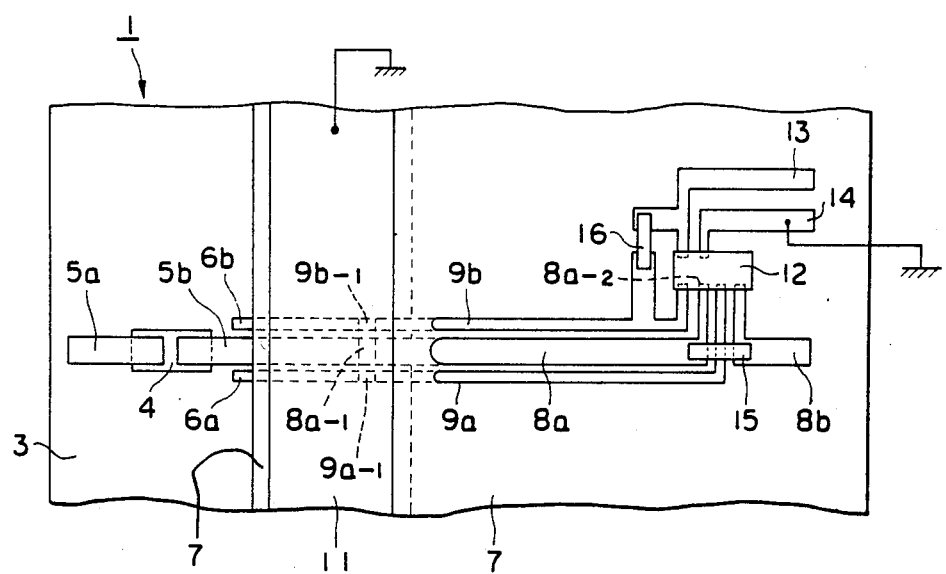
FIG. 2 is a partial, plan view showing the structure of FIG. 1 when viewed from top.

In the plan view of FIG. 2 showing the representative structure of one-to-one image sensor 1, only one of such photoelectric elements 4 is shown, but it should be understood that a plurality of such a photoelectric elements 4 are, in fact, provided as arranged at a predetermined pitch in the form of a single array extending in the longitudinal direction of the sensor board 3. Typically, 2,048 such photoelectric elements 4 are provided in a single array which is divided into 64 blocks or groups each having 32 elements 4 for simplifying sequential driving or scanning of individual photoelectric elements 4 from one end to the other. As mentioned previously, the photoelectric element 4 is preferably formed on the sensor board 3 from a selected photoconductive material using a thin-film forming technique, such as vapor deposition and sputtering. A pair of electrically conductive lines 5a and 5b are also formed on the sensor board 3 as extending on opposite sides of and each in contact with the photoelectric element 4. It is to be noted that such a pair of conductive lines 5a and 5b are provided for each of the photoelectric elements 4 forming the array, and these electrically conductive lines 5a and 5b are also preferably formed on the sensor board 3 as deposited thereon, for example, by using any well know thin-film forming technique. Thus, the sensor board 3 is required to be electrically insulating at least at its top surface on which the photoelectric element 4 and lead lines 5a and 5b are formed.

The electrically conductive line 5a makes an ohmic contact with the photoelectric element 4 at one end and is connectable to a constant supply voltage $V_{IN}$ at the other end. On the other hand, the other electrically conductive line 5b also makes an ohmic contact with the photoelectric element 4 at a point opposite to the point of ohmic contact between the line 5a and the element 4, and the line 5b extends across the sensor board 3 to a point near the opposite end to form a contact portion there. As may be seen, the line 5b constitutes a signal line for leading an electrical signal produced by the photoelectric element 4 to a desired location, or in this case ultimately to an operational amplifier.

Of importance, as one feature of the present invention, a pair of guard lines 6a and 6b are also formed on the sensor board 3 as extending on both sides of the signal line 5b. These guard lines 6a and 6b are also formed from an electrically conductive material, and, as will be described later, these guard lines 6a and 6b are connected to a reference potential, preferably ground potential, for shielding the signal line 5b thereby preventing an electrical signal carried on the signal line 5b from being adversely affected by external noises. The guard lines 6a and 6b extend substantially as long as and one on each side of the signal line as spaced therefrom and contact portions are formed at the ends of the guard lines 6a and 6b which are separated further away from the photoelectric element 4.

A flexible tape 7 is provided as extending between and substantially covering the support 2 and the sensor board 3. The flexible tape 7 is provided with a printed circuit, a part of which is shown in FIG. 2 as electrically conductive lead lines 8a, 8b, 9a, 9b, 13 and 14. The line 8a is provided as partly extending on the top surface if flexible tape 7 and partly on the bottom surface thereof as passing through a through-hole 7a provided approximately at a center of the tape 7. At one end of the line 8a is provided a contact portion 8a-1 which makes an ohmic contact with the contact portion of the line 5b formed on the sensor board 3, and, at the other end, the line 8a is provided with the other contact portion 8a-2 formed on the top surface of the flexible tape 7, which is in ohmic contact with one of the pads of an operational amplifier 12 in the form of an integrated circuit chip. Thus, the line 8a also, in effect, forms a signal line and it leads an electrical signal from the the photoelectric element 4 through the line 5b to the operational amplifier 12.

A pair of guard lines 9a and 9b are also provided on the flexible tape 7 extending substantially as long as and one on each side of the signal line 8b. Each of the guard lines 9a and 9b is provided as extending partly on the top surface of the flexible tape 7 and partly on its bottom surface similarly with the signal line 8a. These guard lines 9a and 9b are also comprised of an electrically conductive material and they are electrically connected to ground through an internal circuit of operational amplifier 12 and another lead line 14. Those sections of the guard lines 9a and 9b which are formed on the bottom surface of the flexible tape 7 are provided with contact portions 9a-1 and 9b-1 at their ends, which are in ohmic contact with the respective contact portions 6a and 6b of the guard lines 6a and 6b on the sensor board 3.

With the above-described structure, a signal input line defined by conductive leads 5b and 8a is protected by guard lines 6a-9a and 6b-9b on both sides so that an electrical signal carried on this signal input line is prevented from being adversely affected by other signals carried on adjacent signal lines or other external noises. The op amp I.C. 12 is provided with a plurality of pads at its bottom as arranged along two opposite ends, and the op amp I.C. 12 is integrally mounted on the flexible tape 7 with its pads bonded to contact portions, such as contact portion 8a-2, of associated lead lines, for example, by thermocompression bonding. The other lead lines shown in FIG. 2 as provided on the flexible tape 7 include an electrically conductive line 8b as an output line for leading an amplified electrical signal to a desired position and another electrically conductive line 13 as a power supply line for supplying power to the operational amplifier 12.

It is to be noted, however, that a layout of the printed circuit on the flexible tape 7 shown in FIG. 2 is just an example and the layout may be different in structure. In reality, more lead lines than those shown in FIG. 2 are provided as printed on the flexible tape 7. In the structure illustrated in FIG. 2, a feed-back resistor 15 is provided as bridging between the lead lines 8a and 8b, and this is connected between the input and output terminals of operational amplifier 12. Also provided is a capacitor 16 as connected between the power supply line 13, which in turn is connected to a power supply voltage $V_{CC}$, and the guard line 9b connected to ground, and this capacitor is provided to stabilize the supply voltage applied to the operational amplifier 12.

Since electrically conductive lines are provided on both top and bottom surfaces of the flexible tape 7 in the form of a printed circuit, the flexible tape 7 is required to be electrically insulating at least at its top and bottom surfaces. Besides, the flexible tape 7 is provided with through-holes, e.g., through-hole 7a, for electrically connecting the leads on the top surface and the leads on the bottom surface, these through-holes must also be covered with an insulating layer if the flexible tape 7 itself is not electrically insulating. Thus, it is preferable to form the flexible tape 7 itself from an electrically insulating material. It is to be noted that a belt 11 of electrically conductive material is formed on the flexible tape 7 at that portion overlying the sensor board 3 as extending substantially as long as the sensor board 3. As shown in FIG. 2, this belt 11 is connected to ground. Although not shown specifically in FIG. 2 for the purpose of simplicity, a plurality of photoelectric elements 4 are provided on the sensor board 3 as arranged in the form of a single array as described previously, and such a plurality of photoelectric elements are grouped into a plurality of blocks, each of which includes a predetermined number of photoelectric elements 4. Thus, in reality, on the sensor board 3 is formed a plurality of electrically conductive lines, including signal line 5b and guard lines 6a and 6b, as arranged side by side, which are substantially covered by the grounded belt 11. In the illustrated embodiment, those signal lines and guard lines, such as 5b, 6a and 6b, formed on the sensor board 3 are sealed by the grounded belt 11 formed on the flexible belt 7 from above against possible external noises.

As shown in FIG. 1, also provided is a cover 17 having its one end resting on the belt 11 under pressure and its opposite end fixedly attached to the support 2, for example, by means of bolts. This cover 17 is also preferably comprised of an electrically conductive material such that the cover 17 is electrically connected to the belt 11 as well as to the support 2. Although not shown in the drawings, the cover 17 is clamped to the support 2 preferably by bolts at the right-hand end in FIGS. 1 and 2, and its free end (left-hand end in these figures) presses the flexible tape 7 downwardly against the sensor board 3 and thus the support 2 when the cover 17 is so clamped. In the illustrated embodiment, the cover 17 is so formed to substantially cover the flexible tape 6 excepting that portion where the belt 11 is provided. Thus, in the embodiment shown in FIGS. 1 and 2, all of the combined signal lines, e.g., 5b and 8a, are each protected by a pair of grounded guard lines, e.g., 6a-9a and 6b-9b, in the lateral direction and by the grounded support 2 and the grounded belt 11 and cover 17 in the vertical direction, so that the signals lines, such as 5b and 8a, are completely enclosed thereby allowing to prevent electrical signals carried on these signal lines from being adversely affected from all directions. Therefore, even if an electrical signal produced from the photoelectric element is relatively low in level, this may be supplied to the operational amplifier 12 without being adversely affected by external noises, which permits to carry out an optical reading operation of original at extremely high resolution.

Figure 3:
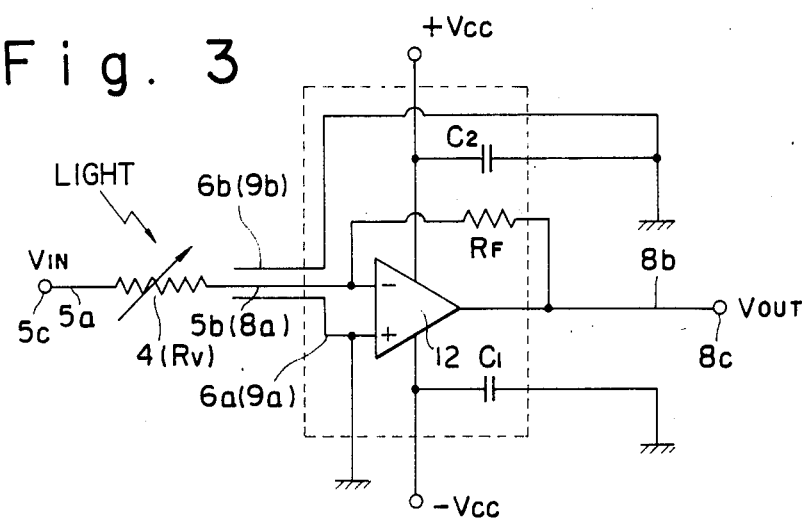
FIG. 3 is an equivalent electrical circuit diagram for each photoelectric sensing element of the one-to-one image sensor shown in FIGS. 1 and 2.

FIG. 3 is a circuit diagram equivalent to the electrical structure of a cell of photoelectric element 4. As shown, a predetermined constant input voltage $V_{IN}$ is applied to an input terminal 5c, which is then supplied to the thin-film photoelectric element 4 via the power supply line 5a. The photoelectric element 4 has a variable resistive value $R_V$ which varies depending on the amount of light impinging on the thin-film element 4. The opposite side of the photoelectric element 4 is connected to an inverting input terminal of operational amplifier 12 via the signal lines 5b-8a, and the operational amplifier 12 has its non-inverting input terminal connected to the guard lines 6a-9a and to ground and its output terminal to a device output terminal 8c through the output signal line 8b to provide an output signal $V_{OUT}$. With this structure, the op amp 12 functions as an inverting amplifier and the output signal $V_{OUT}$ is determined by modifying the constant input voltage $V_{IN}$ with a ratio between the resistance $R_F$ of feed-back resistor 15 and the resistance $R_V$ of thin-film element 4.

Also shown in FIG. 3 is the guard lines 6b-9b extending substantially along one side of the signal lines 5b-8a, and these guard lines are also connected to ground. The op amp 12 is connected to a positive supply voltage $+V_{CC}$ and to a negative supply voltage $-V_{CC}$, and the power supply lines extending between the op amp 12 and the positive and negative supply voltages are connected with capacitors $C_1$ and $C_2$, respectively, for the purpose of stabilizing the supply voltages to be applied to the op amp 12. It is to be noted that in the illustrated embodiment all of the elements present in the dotted line square shown in FIG. 3 are mounted on the flexible tape 7.

Figure 4:
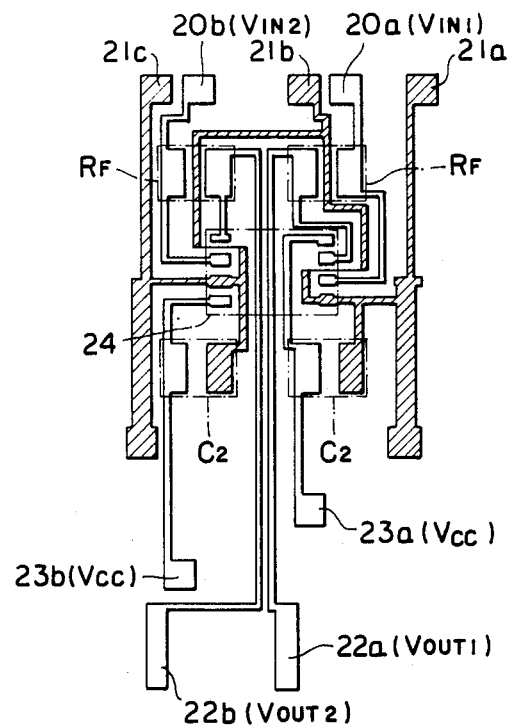
FIG. 4 is a schematic illustration showing a specific example of a layout of print circuit on a flexible medium embodying the present invention.

FIG. 4 schematically illustrates a layout of electrically conductive lines formed as printed on the flexible tape 7 in accordance with one embodiment of the present invention. As shown, a pair of input signal lines 20a, 20b are provided, and one end of each of these signal lines is connected to the corresponding pad provided at the bottom surface of op amp I.C. chip 24, which is of the dual type having two op amp circuits on a single chip. Thus, in effect, each of the input singal lines 20a and 20b is connected to the corresponding one of the two op amp circuits formed in the I.C. chip 24. A grounded line 21a extend substantially along one side of the input signal line 20a along the other side of which extends one branch of bifurcated ground line 21b. On the other hand, the other branch of bifurcated ground line 21b extends substantially along one side of the other input signal line 20b along the other side of which extends a further grounded line 21c. In effect, both sides of each of the input signal lines 20a and 20b are protected by grounded guard lines. It is to be noted that in FIG. 4 grounded lines are all indicated as hatched.

As may be obvious, the input signal lines 20a and 20b are connected to respective photoelectric elements 4 via respective lead lines so that electrical input signals produced by the corresponding photoelectric elements 4 are input to the op amp chip 24 through these lines. As described previously, since these input lines 20a and 20b are sandwiched by grounded guard lines 21a through 21c, electrical input signals transmitted through these input lines 20a and 20b are well prevented from being adversely affected by external noises even if they are relatively low in level. Also shown in FIG. 4 are power supply lines 23a and 23b for leading supply voltages to the op amp chip 24 and output lines 22a and 22b for leading a pair of output signals from the dual type op amp chip 24. Connected between the input and output singal lines is a feed-back resistor $R_F$ having resistance typically ranging from 1 to 100 M-ohms. In addition, connected between the power supply line 23a or 23b and grounded line 21a, 21b or 21c is a supply voltage stabilizing capacitor $C_2$ whose capacitance typically ranges from 0.01 to 0.1 micro-F.

Figure 5:
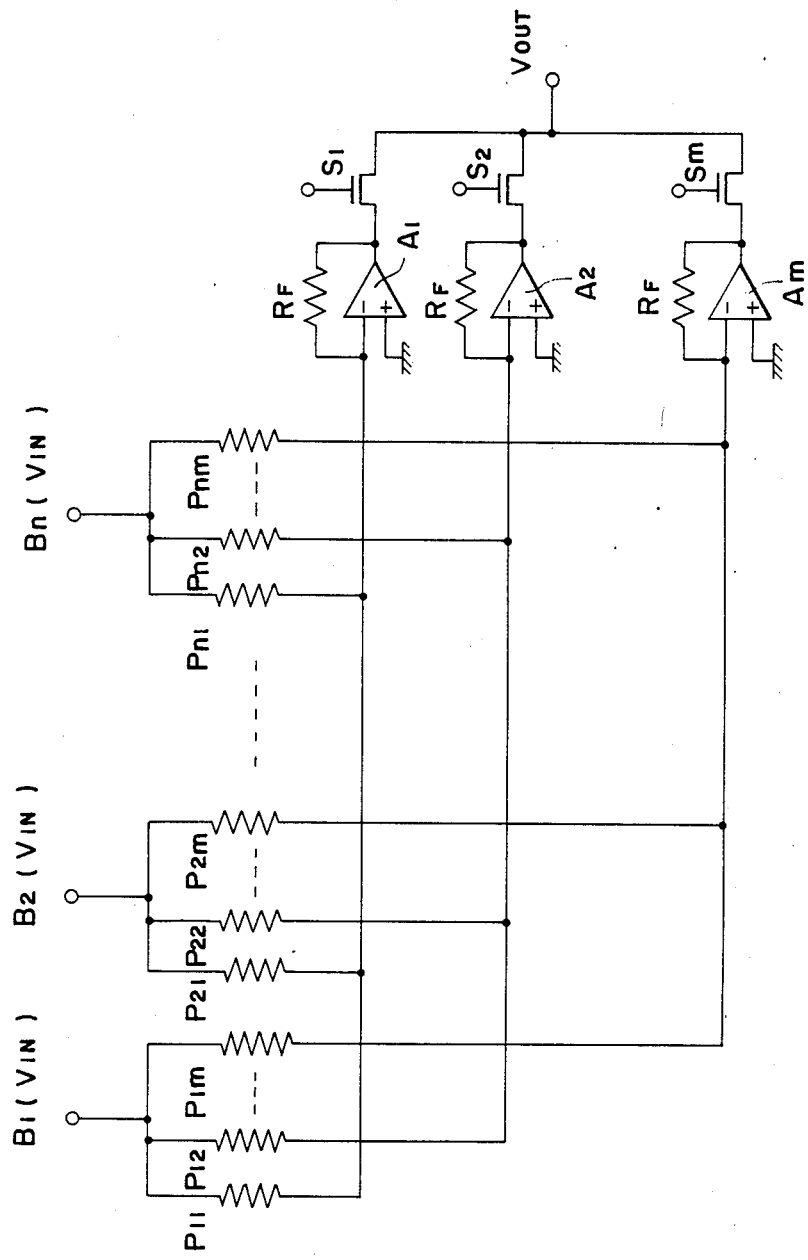
FIG. 5 is a circuit diagram showing the overall electrical structure of one-to-one image sensor to which the present invention may be advantageously applied.

FIG. 5 illustrates the overall electrical structure of a one-to-one image sensor which may be advantageously constructed based on the principle of the present invention. In the illustrated structure, a plurality of thin-film photoelectric elements $P_{11}$ through $P_{nm}$ are arranged in a single array at a predetermined pitch as divided into n number of blocks, each having m number of elements $P_{ij}$. In each block, the photoelectric elements $P_{ij}$ are commonly connected at their top ends and to the corresponding power supply terminal $B_i$ to which the constant supply voltage $V_{IN}$ is applied. The bottom ends of photoelectric elements $P_{ij}$ define individual electrodes and one of the individual electrodes in one block is connected to the corresponding individual electrodes of the other blocks and also to an inverting input terminal of corresponding one of op amps $A_1$ through $A_m$. Each of the op amps $A_1$ through $A_m$ has its output terminal connected to its inverting input terminal via a feed-back resistor $R_F$ and also to an output terminal $V_{out}$ through the corresponding one of analog switches $S_j$ through $S_m$. In such a structure, as easily appreciated, the inverting input terminal of each of the op amps $A_1$ through $A_m$ always remain in a virtual ground state so that the plurality of photoelectric elements $P_{11}$ through $P_{nm}$ may be operated independently from one another.

As described above, in accordance with the present invention, low-level signals may be properly fed into an amplifier circuit without being adversely affected by external noises so that resolution in optically reading an original can be greatly enhanced. In particular, when applied to a one-to-one image sensor, the overall length of signal lines may be made shorter and the signal lines are enclosed by a grounded sealed structure so that signal currents even low in level may be properly lead into op amp I.C. chips without distortions due to external noises. Besides, since the lines may be made shorter in length, the operational speed can be increased. Moreover, when applied to a one-to-one image sensor, since the photoelectric element array and its driver circuit including op amp chips may be formed on separate substrates, the yield in manufacture of such image sensors may be enhanced and thus the cost may be lowered.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. An electronic device carrier structure, comprising:
    a substrate having an electrically insulating surface and comprising an electrically insulating, flexible tape;
    at least one signal input line formed from an electrically conductive material and extending on said electrically insulating surface, said signal input line having a signal input end and a first connecting end at the other end;
    at least one signal output line formed from an electrically conductive material and extending on said electrically insulating surface, said signal output line having a signal output end at one end and a second connecting end at the other end;
    at least one electronic device carried on said substrate and connected to said first and second connecting ends;
    at least a pair of guard lines each of which is formed on said electrically insulating surface and extends substantially along a corresponding side of said at least one signal input line; and
    an electrically conductive support for supporting thereon said flexible tape and an electrically conductive cover which is electrically connected to and fixedly attached to said electrically conductive support for substantially covering said flexible tape from above.

2. The structure of claim 1 wherein said support is connected to ground.

3. The structure of claim 1 wherein said guard lines are comprised of an electrically conductive material and connected to ground.

4. The structure of claim 1 wherein said electronic device is an integrated circuit in the form of one chip.

5. The structure of claim 4 wherein said one-chip integrated circuit includes at least one operational amplifier.

* * * * *